(12) United States Patent
Kim et al.

(10) Patent No.: US 8,206,536 B2
(45) Date of Patent: Jun. 26, 2012

(54) METHOD OF STACKING FLEXIBLE SUBSTRATE

(75) Inventors: Gi Heon Kim, Daejeon (KR); Yong Hae Kim, Gyeonggi-do (KR); Dong Jin Park, Daegu (KR); Chul Am Kim, Seoul (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/231,266

(22) Filed: Sep. 13, 2011

(65) Prior Publication Data

US 2012/0000602 A1  Jan. 5, 2012

Related U.S. Application Data

(62) Division of application No. 11/774,855, filed on Jul. 9, 2007, now Pat. No. 8,038,820.

(30) Foreign Application Priority Data

Aug. 30, 2006  (KR) .................. 10-2006-0082746

(51) Int. Cl.
*H05K 13/04* (2006.01)
*B32B 37/10* (2006.01)
(52) U.S. Cl. ................ 156/230; 156/247; 174/264
(58) Field of Classification Search .................. 174/254, 174/259; 156/580–581, 583.1–583.4, 583.6–583.91
See application file for complete search history.

(56) References Cited

U.S. PATENT DOCUMENTS

| 53,465 | A | | 3/1866 | McBurney |
|---|---|---|---|---|
| 4,255,469 | A | | 3/1981 | McGinness |
| 4,854,445 | A | | 8/1989 | Eaton et al. |
| 5,184,284 | A | | 2/1993 | Ashelin et al. |
| 5,399,223 | A | | 3/1995 | Vogt |
| 5,597,633 | A | | 1/1997 | Mecke et al. |
| 5,894,409 | A | | 4/1999 | Tanaka |
| 5,972,152 | A | | 10/1999 | Lake et al. |
| 6,015,607 | A | * | 1/2000 | Fraivillig ............ 428/214 |
| 6,020,218 | A | | 2/2000 | Shim et al. |
| 7,384,683 | B2 | | 6/2008 | Echigo et al. |
| 2004/0182816 | A1 | | 9/2004 | Chung et al. |

(Continued)

FOREIGN PATENT DOCUMENTS

JP  2001-042340 A  2/2001

(Continued)

OTHER PUBLICATIONS

USPTO OA mailed Oct. 20, 2009 in connection with U.S. Appl. No. 11/774,855.

(Continued)

*Primary Examiner* — Katarzyna Wyrozebski Lee
*Assistant Examiner* — Scott W Dodds
(74) *Attorney, Agent, or Firm* — Ladas & Parry LLP

(57) ABSTRACT

A method of stacking a flexible substrate is provided. The method includes the steps of: preparing a carrier substrate; stacking an adhesive layer on the carrier substrate; and stacking a flexible substrate having at least one image display device on the adhesive layer using a laminating or pressing method. Thus, the flexible substrate is easily fabricated without modification of conventional mass-production equipment for fabricating a display, and thereby a lightweight, thin, and compact flexible display can be realized.

5 Claims, 3 Drawing Sheets

U.S. PATENT DOCUMENTS

2005/0214963 A1  9/2005  Daniels et al.

FOREIGN PATENT DOCUMENTS

| JP | 2002-148607 | A | 5/2002 |
|---|---|---|---|
| KR | 2020000017818 | A | 10/2000 |
| KR | 1020010004872 | A | 1/2001 |
| KR | 1020010070103 | A | 7/2001 |
| KR | 1020020031324 | A | 5/2002 |
| KR | 1020020060659 | A | 7/2002 |
| KR | 1020040012291 | A | 2/2004 |
| KR | 1020050060196 | A | 6/2005 |
| KR | 1020050085082 | A | 8/2005 |
| KR | 1020050104812 | A | 11/2005 |
| KR | 1020060059605 | A | 6/2006 |
| WO | 02/091340 | A1 | 11/2002 |

OTHER PUBLICATIONS

USPTO OA mailed Mar. 12, 2010 in connection with U.S. Appl. No. 11/774,855.

USPTO OA mailed Jul. 14, 2010 in connection with U.S. Appl. No. 11/774,855.

USPTO NOA mailed Jul. 8, 2011 in connection with U.S. Appl. No. 11/774,855.

* cited by examiner

METHOD OF STACKING FLEXIBLE SUBSTRATE

CROSS-REFERENCE TO RELATED APPLICATION

This application claims priority to and the benefit of Korean Patent Application No. 2006-0082746, filed Aug. 30, 2006, the disclosure of which is incorporated herein by reference in its entirety.

BACKGROUND

1. Field of the Present Invention

The present invention relates to a method of stacking a flexible substrate, and more particularly, to a method of fabricating a flexible substrate capable of preventing bending of the flexible substrate without modification of production lines of conventional semiconductor and display devices.

2. Discussion of Related Art

As modern society is becoming increasingly information-oriented, the importance of the display unit, which enables visualization of various types of information output from various devices, is increasing. Moreover, this trend is expected to continue for some time. As the information revolution progresses, the demand for information increases proportionately. In the field of displays, which are man-machine interfaces for information delivery, research aimed at enabling viewing without constraints and expressing true colors and the full intricacy of nature is actively progressing.

In general, displays have been widely adapted in TVs, monitors and mobile phones. However, as technology develops, there is increasing demand for displays that are small, lightweight, have wide views, superior resolution, and fast response times. In reaction to such demand, efforts have been stepped up to enlarge displays and reduce the density and thickness of their glass substrate.

However, such efforts cause problems in ensuring processability and reliability, and thus technological limits are confronted. An additional problem is that downsizing of display devices for portability clashes with consumers' desire for widescreen displays. Thus, in order to simultaneously obtain superior flexibility, light weight, and portability, a need has arisen for a flexible display substrate in which interconnections and elements of the display are formed on a flexible substrate.

However, when using a flexible substrate to form an image display device, a difference in coefficient of thermal expansion between the flexible substrate and a carrier substrate may result in the application of stress to an adhesive layer joining the two substrates in a high temperature process (150-250° C.). An additional problem is that, because it lacks rigidity, the flexible substrate cannot be processed by conventional semiconductor manufacturing equipment or by display manufacturing equipment for liquid crystal displays and e-paper. So, it is necessary to either develop special equipment or drastically modify the conventional manufacturing equipment. Existing display set providers such as Sharp and Phillips have invented a chuck for a flexible display and applied it to a conventional manufacturing process. However, this method leads to difficulties in mass-production and processing and, consequently, higher production costs.

SUMMARY OF THE PRESENT INVENTION

The present invention is directed to providing a method of stacking a flexible substrate capable of preventing bending of the flexible substrate using conventional display manufacturing equipment applied in flexible display fabrication.

One aspect of the present invention provides a method of stacking a flexible substrate comprises the steps of: preparing a carrier substrate; stacking an adhesive layer on the carrier substrate; and stacking a flexible substrate having at least one image display device on the adhesive layer using a laminating or pressing method.

To stack the adhesive layer, the laminating or pressing method may be used. The laminating method may use a laminator having an upper roller rolling over the adhesive layer or the flexible substrate, and a lower roller rolling under the carrier substrate. Also, the laminating method may use a laminator having an upper roller rolling over the adhesive layer or the flexible substrate, and a lower support formed under the carrier substrate.

The pressing method may use a presser having an upper presser formed over the adhesive layer or the flexible substrate and movable vertically, and a fixed presser formed under the carrier substrate or a lower presser movable vertically.

The laminator and the presser may further comprise a protective body formed in a region with which the carrier substrate, the adhesive layer or the flexible substrate contacts in order to prevent damage to the carrier substrate, the adhesive layer or the flexible substrate. The protective body made of rubber or fabric may be coated or stacked.

The laminator and the presser may be controlled within a temperature range from 0 to 160° C. The laminator and the presser may be controlled mechanically or by air pressure. The laminator may be controlled within an air pressure range from 0.1 to 10 $kg/cm^2$. The presser may be controlled within an air pressure range from 0.1 to 100 $kg/cm^2$. The step of stacking the adhesive layer and the flexible substrate may be performed under atmospheric pressure, inert atmosphere or vacuum. The carrier substrate may be formed of glass or silicon.

The adhesive layer may comprise a support, and adhesive agent layers formed on and under the support. The support may be formed of one of polyethylene terephthalate, polybutylenes terephthalate, polyimide, polyester, and polyolefine. The flexible substrate may be formed of one of a metal thin film, plastic and ultra thin glass.

After forming the image display device on the flexible substrate, the present invention may further comprise the step of removing the carrier substrate therefrom.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

A method of stacking a flexible substrate and a method of fabricating a flexible display according to the present invention will now be described more fully hereinafter with reference to the accompanying drawings, in which exemplary embodiments of the present invention are shown.

FIGS. 1A to 1D are cross-sectional views illustrating a method of stacking a flexible substrate according to an exemplary embodiment of the present invention.

Figure 1A:
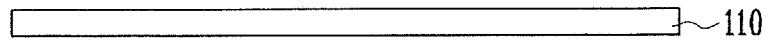
FIGS. 1A to 1D are cross-sectional views schematically illustrating a method of stacking a flexible substrate according to an exemplary embodiment of the present invention.
Figure 1B:
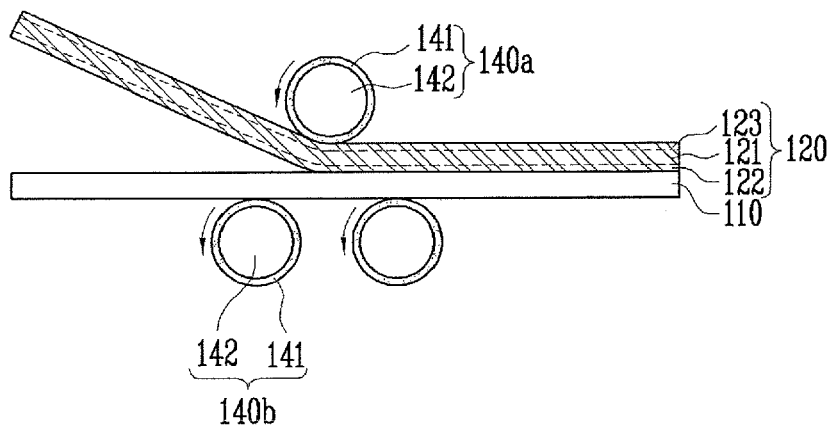

Referring to FIG. 1A, a carrier substrate 110 is prepared. The carrier substrate 110 may be formed of various kinds of materials, for example, glass, silicon, etc. Referring to FIG. 1B, an adhesive layer 120 is stacked on the carrier substrate 110. The adhesive layer 120 is composed of a support 121 and bonding materials 122 and 123 respectively formed on and under the support 121. The support 121 may be formed of polyethylene terephthalate, polybutylenes terephthalate, polyimide, polyester, or polyolefine.

As illustrated in FIG. 1B, the adhesive layer 120 is disposed by a laminator method using rollers 140a and 140b. Rollers rolling in the same direction are prepared under the carrier substrate 110 and over the adhesive layer 120, and upper and lower rollers 140a and 140b formed over and under the carrier substrate 110 roll over and under the carrier substrate 110 so as to dispose the adhesive layer 120 thereon.

Figure 1C:
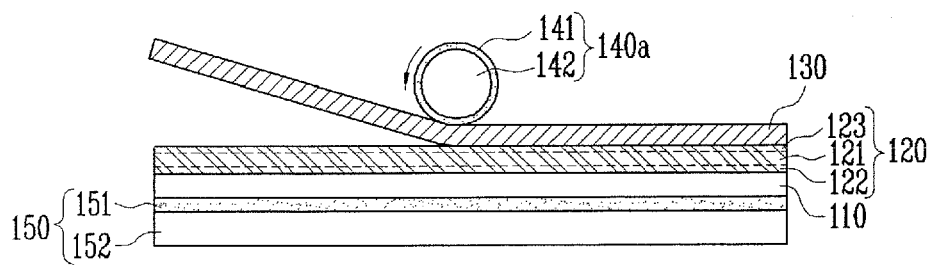

In the next step, as illustrated in FIG. 1C, a flexible substrate 130 on which an image display device will be formed is stacked on the adhesive layer 120 using the roller 140a. The flexible substrate 130 may be a metal thin film (stainless foil and aluminum thin film), a thin glass substrate (e.g., thinner than 0.3 mm) or a plastic substrate. To stack the flexible substrate 130, the upper roller 140a is prepared on the flexible substrate 130, and the lower support 150 is prepared under the carrier substrate 110. By such a structure, the lower support 150 fixes and supports the carrier substrate 110, and the upper roller 140a rolls on the flexible substrate 130 so as to stack the flexible substrate 130.

Meanwhile, the rollers 140a and 140b illustrated in FIGS. 1B and 1C are composed of a roller main body 142 and a protective body 141 surrounding the roller main body 142 and formed of rubber or soft fabric. To minimize damage to the stacked structures (e.g., the adhesive layer, the flexible substrate, the carrier substrate, etc.), the protective body 141 surrounds or coats the roller main body 142. The lower support 150 formed under the carrier substrate 110 is composed of a support main body 152 and a support protective body 151. Like the protective body 141, the support protective body 151 is also formed of rubber or soft fabric.

Referring to FIGS. 1B and 1C, in FIG. 1B, the rollers 140a and 140b are disposed on and under the adhesive layer 120 and a different number of rollers are disposed thereon, respectively. In FIG. 1C, the upper roller 140a is disposed over the flexible substrate 130, and the lower support 150 is disposed under the carrier substrate 110. That is, to stack the adhesive layer 120 and the flexible substrate 130, without regard to the number of the rollers 140a and 140b, a support supporting the carrier substrate may be used instead of the roller. When using the rollers, one to five rollers may be used over and under the carrier substrate, respectively. A gap between the rollers may be controlled to ensure close adhesion between the carrier substrate 110 and the adhesive layer 120, and between the adhesive layer 120 and the flexible substrate 130. Here, the gap between the rollers 140a and 140b may be controlled mechanically and by air pressure. When the gap between the rollers is controlled by air pressure, the air pressure may depend on the size and use of the adhesive layer 120 or the flexible substrate 130, but preferably be 0.1 to 10 kg/cm$^2$. Also, a preferable temperature of the rollers 140a and 140b is in the range of 0 to 160° C. to enhance the close adhesion between the carrier substrate 110 and the adhesive layer 120.

In the embodiments described above, the adhesive layer 120 utilizes the upper and lower rollers 140a and 140b, and the flexible substrate 130 utilizes the upper roller 140a and the lower support 150, but these may be freely changed.

Figure 1D:
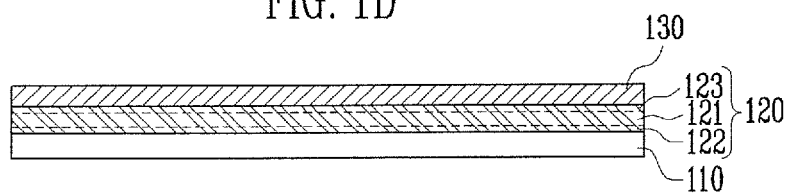

FIG. 1D illustrates a stacking structure of a flexible substrate fabricated by the stacking method of the flexible substrate shown in FIGS. 1A to 1C. As illustrated in FIG. 1D, the stacking structure of the flexible substrate is composed of the carrier substrate 110, the adhesive layer 120 and the flexible substrate 130.

Figure 2A:
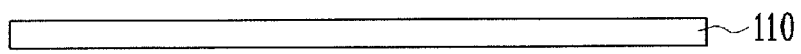
FIGS. 2A to 2C are cross-sectional views schematically illustrating a method of stacking a flexible substrate according to another exemplary embodiment of the present invention.
Figure 2B:
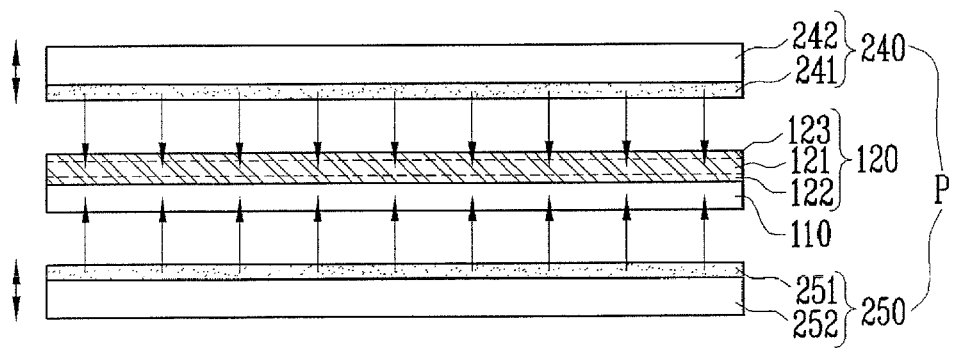
Figure 2C:
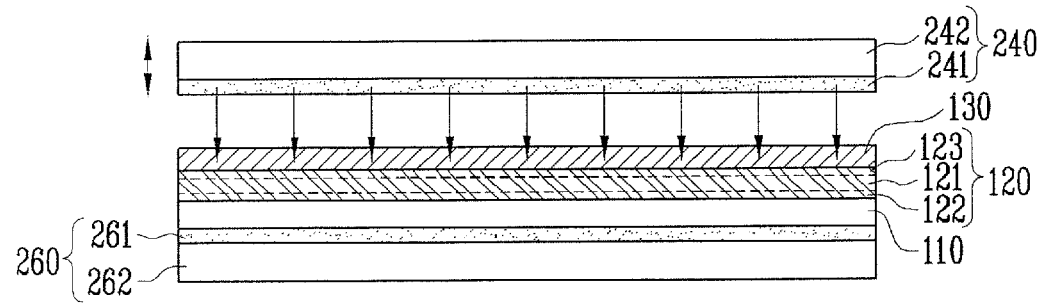

FIGS. 2A to 2C are cross-sectional views schematically illustrating a method of stacking a flexible substrate according to another exemplary embodiment of the present invention.

Referring to FIGS. 2A to 2C, a carrier substrate 110 is prepared, and an adhesive layer 120 is stacked on the carrier substrate 110. The adhesive layer 120 is stacked using a presser P, and the presser P is composed of an upper presser 240 disposed over the adhesive layer 120, and a lower presser 250 or a fixed presser 260. The upper and lower pressers 240 and 250 and the fixed presser 260 are composed of presser main bodies 242, 252 and 262, and protective bodies 241, 251 and 261 corresponding to the adhesive layer 120 formed under the presser main bodies 242, 252 and 262 and protecting structures which will be stacked later. The protective bodies 241, 251 and 261 are made of rubber or soft fabric, and coated or stacked on the presser main bodies 242, 252 and 262, respectively. Referring to FIG. 2B, the upper and lower pressers 240 and 250 move vertically and press the structures. And, referring to FIG. 2C, the upper presser 240 which can move vertically and the fixed presser 260 press the structures. The presser P may operate at a temperature ranging from 0 to 160° C., and be controlled mechanically or by air pressure for close adhesion to the adhesive layer 120 or the flexible substrate 130. When the presser P is controlled by air pressure, the air pressure may be in a range of 0.1 to 100 kg/cm$^2$. When the presser is controlled mechanically, pressure may be controlled by a screw, etc. Also, the presser P may ensure the close adhesion of the adhesive layer 120 by operating under atmospheric pressure, inert atmosphere or vacuum. Then, a flexible substrate 130 is stacked on the adhesive layer 120 using the presser P as described above.

In the above-described embodiment, the adhesive layer 120 utilizes the upper and lower pressers 240 and 250 which can move vertically, and the flexible substrate 130 utilizes the upper presser 240 which can move vertically, and the fixed presser 260 disposed under the substrate. However, the present invention may not be limited to the embodiment, and freely make other choices.

Figure 3A:
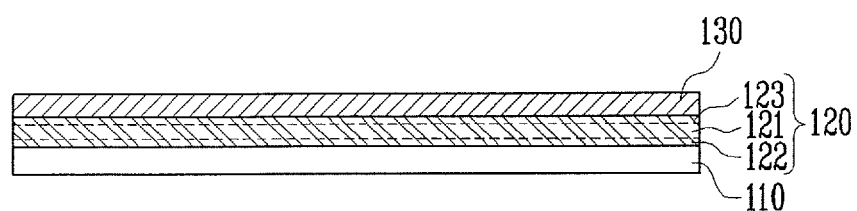
FIGS. 3A to 3C are cross-sectional views schematically illustrating a method of fabricating a display having a flexible substrate using a method of stacking the flexible substrate according to the present invention.
Figure 3B:
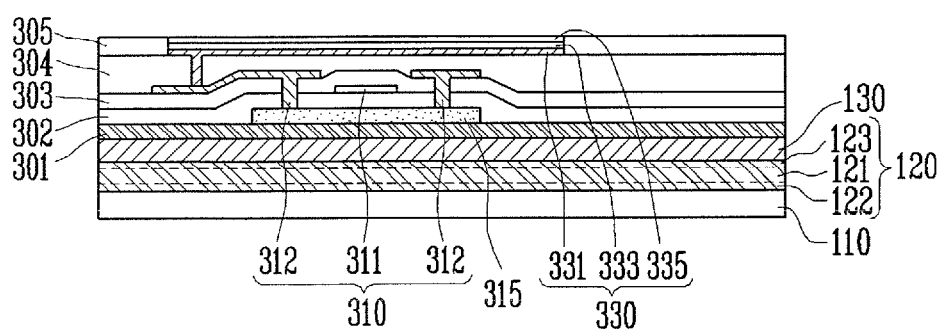
Figure 3C:
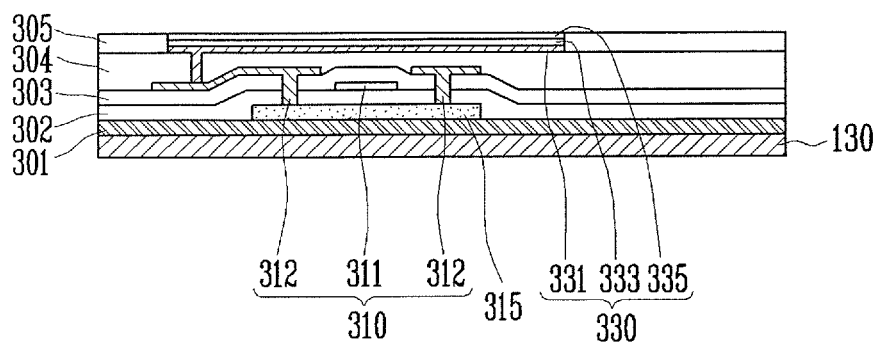

FIGS. 3A to 3C are cross-sectional views schematically illustrating a method of fabricating a display having a flexible substrate using a method of stacking the flexible substrate according to the present invention.

In the exemplary embodiment, first, a carrier substrate 110, an adhesive layer 120, and a flexible substrate 130 are sequentially stacked. When the flexible substrate 130 is stacked on the carrier substrate 110, an image display device including a light-emitting device 330 and a transistor 310, i.e. a driving device is formed on the flexible substrate 130. To form the light-emitting device 330 and the transistor 310, a buffer layer 301 and a semiconductor layer 315 are sequentially formed on the flexible substrate 130, and a gate insulating layer 302, a gate electrode 311, an interlayer insulating layer 303, source and drain electrodes 312 and a passivation layer 304 are formed on the semiconductor layer 315. Then, the light-emitting device 330 electrically connected to the transistor 310 through a contact hole (not illustrated) formed in the passivation layer is formed on the transistor 310 including the gate electrode 311 and the source and drain electrodes 312. The light-emitting device 330 includes an anode 331, an emission layer 333 and a cathode 335. A pixel defining layer 305 is formed on the anode 331 of the light-emitting device 330 and the passivation layer 304.

As described above, when a display having the image display device including the light-emitting device 330 and the transistor 310 is formed on the flexible substrate 130, the carrier substrate 110 disposed under the flexible substrate 130 is removed. Here, the adhesive layer 120 may be removed with the carrier substrate 110. In this case, the carrier substrate 110 may be removed by heat or pressure.

Consequently, an adhesive layer for a flexible display can offset stress generated by a difference in coefficients of thermal expansion between a flexible substrate and a carrier substrate in a process of forming an image display device on a flexible substrate such as a plastic substrate, thereby effectively reducing bending of the flexible substrate.

Also, a method of stacking a flexible substrate using a laminator or presser with rollers enables mass-production of flexible displays using flexible substrates without an additional investment in manufacturing equipment, because a conventional manufacturing line for semiconductors and displays can be applied to the present invention without equipment modification.

While the present invention has been shown and described with reference to certain exemplary embodiments thereof, it will be understood by those skilled in the art that various changes in form and details may be made therein without departing from the spirit and scope of the present invention as defined by the appended claims.

What is claimed is:

1. A method of stacking a flexible substrate, comprising the steps of:
   preparing a carrier substrate;
   stacking an adhesive layer on the carrier substrate;
   stacking a flexible substrate on the adhesive layer using a laminating or pressing method;
   wherein the flexible substrate is capable of having at least one image display device formed upon the flexible substrate after the flexible substrate has been stacked on the adhesive layer; and
   wherein the steps of stacking the adhesive layer and the flexible substrate are performed under inert atmosphere or vacuum by the pressing method using a presser having an upper presser formed over the adhesive layer or the flexible substrate and movable vertically, and a fixed presser formed under the carrier substrate or a lower presser movable vertically,
   wherein the presser is controlled within an air pressure range from 0.1 to 100 $kg/cm^2$,
   wherein the adhesive layer comprises a support, and adhesive agent layers formed on and under the support,
   wherein the image display device is formed on the flexible substrate, and
   wherein the adhesive layer and the carrier substrate are removed jointly after the image display device has been formed on the flexible substrate.

2. The method according to claim 1, wherein the step of stacking the adhesive layer is performed by the laminating or pressing method.

3. The method according to claim 1, wherein the presser further comprises a protective body formed in a region with which the carrier substrate, the adhesive layer or the flexible substrate contacts in order to prevent damage to the carrier substrate, the adhesive layer or the flexible substrate.

4. The method according to claim 3, wherein the protective body is made of rubber or fabric and is coated or stacked.

5. The method according to claim 1, wherein the presser is controlled mechanically or by air pressure within a temperature range from 0 to 160° C.

* * * * *